(12) United States Patent
Xin et al.

(10) Patent No.: US 10,565,424 B2
(45) Date of Patent: Feb. 18, 2020

(54) DISPLAY PANEL AND DISPLAY DEVICE

(71) Applicant: SHANGHAI TIANMA AM-OLED CO., LTD., Shanghai (CN)

(72) Inventors: Yu Xin, Shanghai (CN); Lijing Han, Shanghai (CN); Xian Chen, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 43 days.

(21) Appl. No.: 16/111,150

(22) Filed: Aug. 23, 2018

(65) Prior Publication Data

US 2018/0365471 A1 Dec. 20, 2018

(30) Foreign Application Priority Data

May 17, 2018 (CN) .......................... 2018 1 0472906

(51) Int. Cl.
*G06K 9/00* (2006.01)
*H01L 51/52* (2006.01)
*H01L 27/32* (2006.01)

(52) U.S. Cl.
CPC .......... *G06K 9/0004* (2013.01); *G06K 9/001* (2013.01); *H01L 27/326* (2013.01); *H01L 27/3216* (2013.01); *H01L 27/3218* (2013.01); *H01L 27/3234* (2013.01); *H01L 27/3265* (2013.01); *H01L 51/5206* (2013.01); *H01L 27/3276* (2013.01); *H01L 51/5209* (2013.01)

(58) Field of Classification Search
CPC .. G06K 9/0004; G06K 9/001; H01L 27/3216; H01L 27/3218; H01L 27/3234; H01L 27/326; H01L 27/3265; H01L 27/3276; H01L 51/5206; H01L 51/5209
See application file for complete search history.

(56) References Cited

U.S. PATENT DOCUMENTS

2016/0049110 A1* 2/2016 Shi ....................... G09G 3/2003
                                                     345/694
2018/0150669 A1* 5/2018 Luo ...................... G06K 9/0004

FOREIGN PATENT DOCUMENTS

CN       107133613 A      9/2017
EP         3410346 A1 * 12/2018 ........... B06B 1/0622

* cited by examiner

*Primary Examiner* — Shefali D Goradia
(74) *Attorney, Agent, or Firm* — Kilpatrick Townsend & Stockton, LLP

(57) ABSTRACT

A display panel is provided. The display panel includes a plurality of pixel units arranged in a fingerprint recognition region. Each of the plurality of pixel units includes a first electrode and a light-emitting layer. A driving unit of each pixel unit includes a storage capacitor. An orthographic projection of the storage capacitor on a plane of the display panel is located within an orthographic projection of the corresponding first electrode on the plane of the display panel. An orthographic projection of the light-emitting layer of each organic light-emitting device on the plane of the display panel is located within an orthographic projection of the corresponding first electrode. A distance between an edge of an orthographic projection of the first electrode and an edge of an orthographic projection of the light-emitting layer of each red and/or green organic light-emitting device is larger that of each blue organic light-emitting device.

15 Claims, 11 Drawing Sheets

DISPLAY PANEL AND DISPLAY DEVICE

CROSS-REFERENCE TO RELATED APPLICATIONS

The present disclosure claims priority to Chinese Patent Application No. 201810472906.1, filed on May 17, 2018, the content of which is incorporated herein by reference in its entirety.

TECHNICAL

The present disclosure relates to the field of display technologies, and in particular, to a display panel and a display device.

BACKGROUND

In recent years, along with the continuous development of display technologies, there are more and more display devices adopting fingerprint recognition for protecting user privacy. When a user operates a display device with a fingerprint recognition function, authority verification can be realized by simply touching the display screen with a finger, and the operation is simple.

When performing the fingerprint recognition with the existing display panel with the fingerprint recognition function, light emitted by a light source is reflected by a finger and then gets into the fingerprint recognition region, which in turn recognizes different fingerprints according to differences in reflected lights of ridges and valleys of the fingerprints. However, with the current structure of the display panel, the light reflected by the finger has a low transmittance within the display panel, resulting in a small amount of light getting into the fingerprint recognition unit, which affects the accuracy of the fingerprint recognition.

SUMMARY

In view of this, the present disclosure provides a display panel and a display device to solve the problem of low fingerprint identification accuracy in the related art.

In one embodiment, the present disclosure provides a display panel. The display panel includes pixel units arranged in a fingerprint recognition region. Each of the plurality of pixel units includes organic light-emitting devices and driving units, the plurality of organic light-emitting devices is electrically connected to the plurality of driving units. Each of the plurality of organic light-emitting devices includes a first electrode, a light-emitting layer and a second electrode that are stacked, and the first electrode is electrically connected to a corresponding driving unit of the plurality of driving units. Each driving unit of the plurality of driving units includes a storage capacitor, and an orthographic projection of the storage capacitor on a plane of the display panel is located within an orthographic projection of a corresponding first electrode on the plane of the display panel. An orthographic projection of the first electrode of each organic light-emitting device of the plurality of organic light-emitting devices on the plane of the display panel is a first orthographic projection, and an orthographic projection of the light-emitting layer of each organic light-emitting device of the plurality of organic light-emitting devices on the plane of the display panel is a second orthographic projection. The second orthographic projection is located within the first orthographic projection. The plurality of organic light-emitting devices includes a red organic light-emitting device, a green organic light-emitting device, and a blue organic light-emitting device. A distance between an edge of the first orthographic projection of the red organic light-emitting device and an edge of the second orthographic projection of the red organic light-emitting device is larger than a distance between an edge of the first orthographic projection of the blue organic light-emitting device and an edge of the second orthographic projection of the blue organic light-emitting device; and/or, a distance between an edge of the first orthographic projection of the green organic light-emitting device and an edge of the second orthographic projection of the green organic light-emitting device is larger than a distance between the edge of the first orthographic projection of the blue organic light-emitting device and the edge of the second orthographic projection of the blue organic light-emitting device.

In another embodiment, the present disclosure further provides a display device, and the display device includes the abovementioned display panel.

BRIEF DESCRIPTION OF DRAWINGS

In order to more clearly illustrate embodiments of the present disclosure, the accompanying drawings used in the embodiments and in the related art are briefly introduced as follows.

DESCRIPTION OF EMBODIMENTS

For better illustrating technical solutions of the present disclosure, embodiments of the present disclosure will be described in detail as follows with reference to the accompanying drawings.

It should be noted that the described embodiments are merely exemplary embodiments of the present disclosure, which shall not be interpreted as providing limitations to the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

It should be understood that the term "and/or" used herein is me iv an association describing associated objects, indicating that there may be three relationships, for example, "A and/or B" indicates three cases, i.e., only A existing, both A and B existing, and only B existing. In addition, the character "/" herein generally indicates that the associated objects form an or relationship there between.

It should be understood that although the electrode may be described using the terms of "first", "second", etc., in the embodiments of the present disclosure, the electrode will not be limited to these terms. These terms are merely used to distinguish electrodes from one another. For example, without departing from the scope of the embodiments of the present disclosure, a first electrode may also be referred to as a second electrode, similarly, a second electrode may also be referred to as a first electrode.

Figure 1:
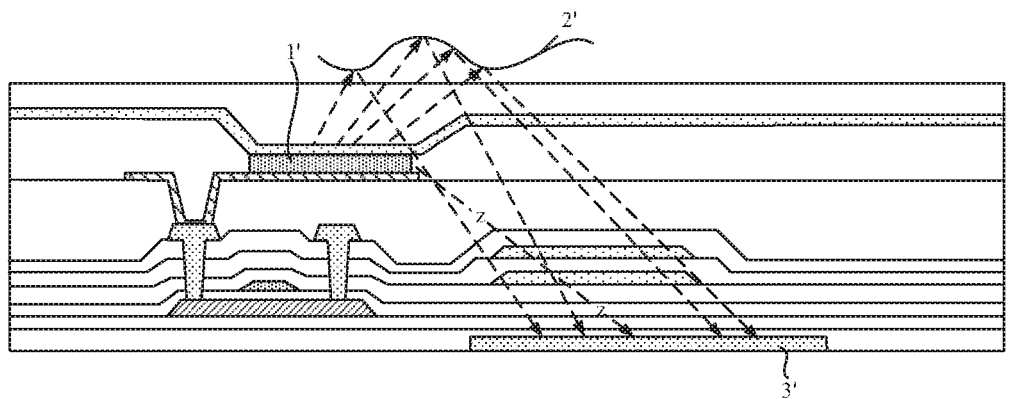
FIG. 1 is a schematic diagram illustrating a principle of fingerprint recognition.

Before explaining the technical solution of the present disclosure in detail, the process of fingerprint recognition is briefly described as follows. As shown in FIG. 1, FIG. 1 is a schematic diagram illustrating a principle of fingerprint recognition. During the fingerprint recognition, light emitted from a light source 1' reaches a finger 2', the light is reflected by the finger 2', then the reflected light reaches a fingerprint recognition unit 3' provided in the display panel, and then the fingerprint recognition unit 3' determines valleys and ridges of the fingerprint based on the light so as to achieve fingerprint recognition for the user.

Figure 2:
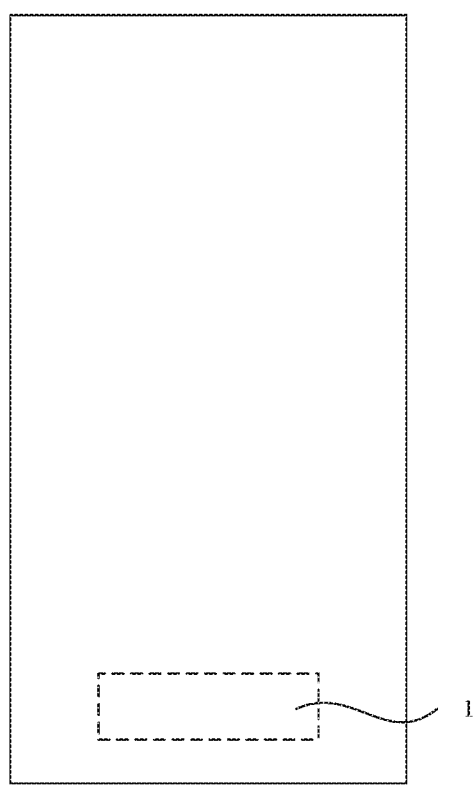
FIG. 2 is a schematic top view of a display panel according to an embodiment of the present disclosure.
Figure 3:
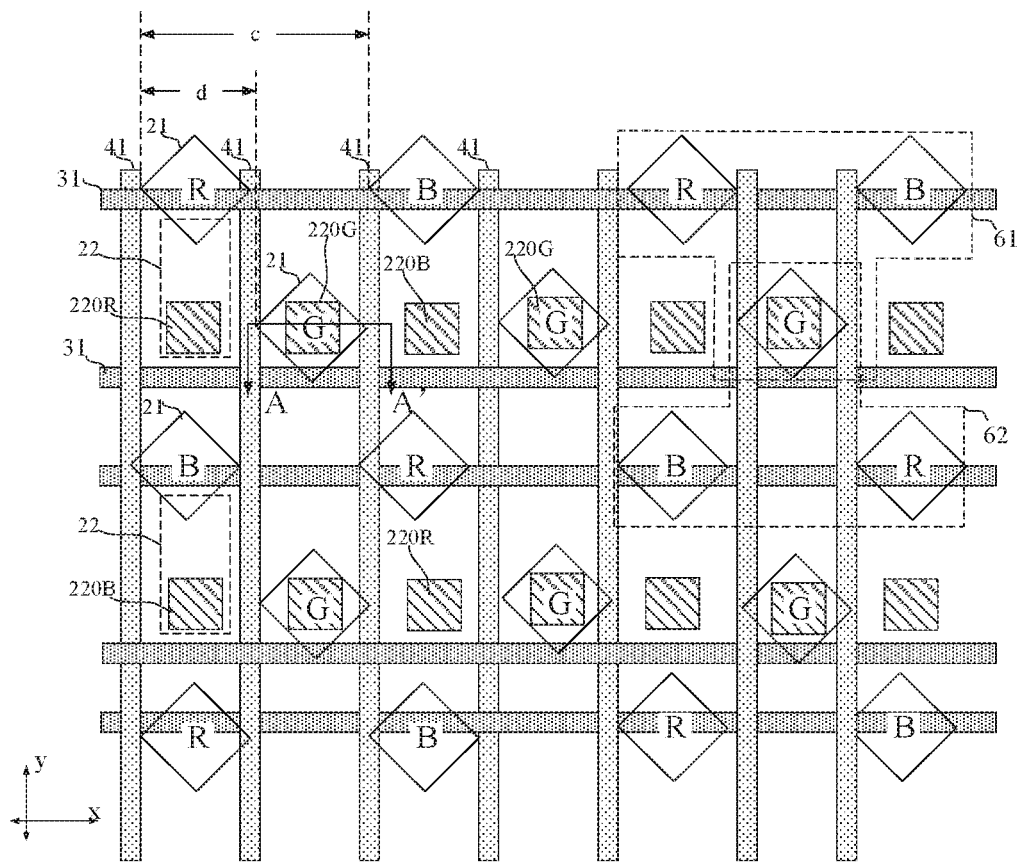
FIG. 3 is a schematic top view of a portion of a fingerprint identification region in FIG. 2.
Figure 4:
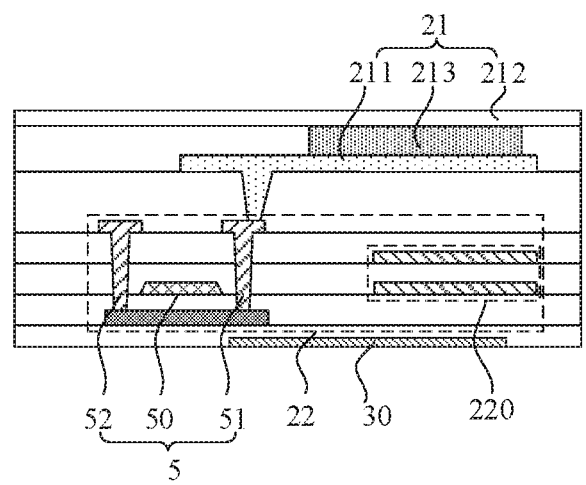
FIG. 4 is a schematic cross-section view along AA' in FIG. 3.

Based on this, an embodiment of the present disclosure provides a display panel. With reference to FIG. 2, FIG. 3, and FIG. 4, FIG. 2 is a schematic top view of a display panel according to an embodiment of the present disclosure; FIG. 3 is a schematic top view of a portion of a fingerprint identification region 1 in FIG. 2; FIG. 4 is a schematic cross-section view along AA' in FIG. 3. As shown in FIG. 2, the display panel includes a fingerprint recognition region 1, and the fingerprint recognition region 1 includes pixel units. As shown in FIG. 3 and FIG. 4, each pixel unit includes an organic light-emitting device 21 and a driving unit 22 that are electrically connected to each other. As shown in FIG. 4, each organic light-emitting device 21 includes a first electrode 211, a light-emitting layer 213, and a second electrode 212 that are stacked. The first electrode 211 of each organic light-emitting device 21 is electrically connected to a corresponding driving unit 22.

As shown in FIG. 3 and FIG. 4, each driving unit 22 includes a storage capacitor 220. At least one storage capacitor 220 has an orthographic projection on the plane of the display panel, which is located within an orthographic projection of the corresponding first electrode 211 on the plane of the display panel.

Figure 5:
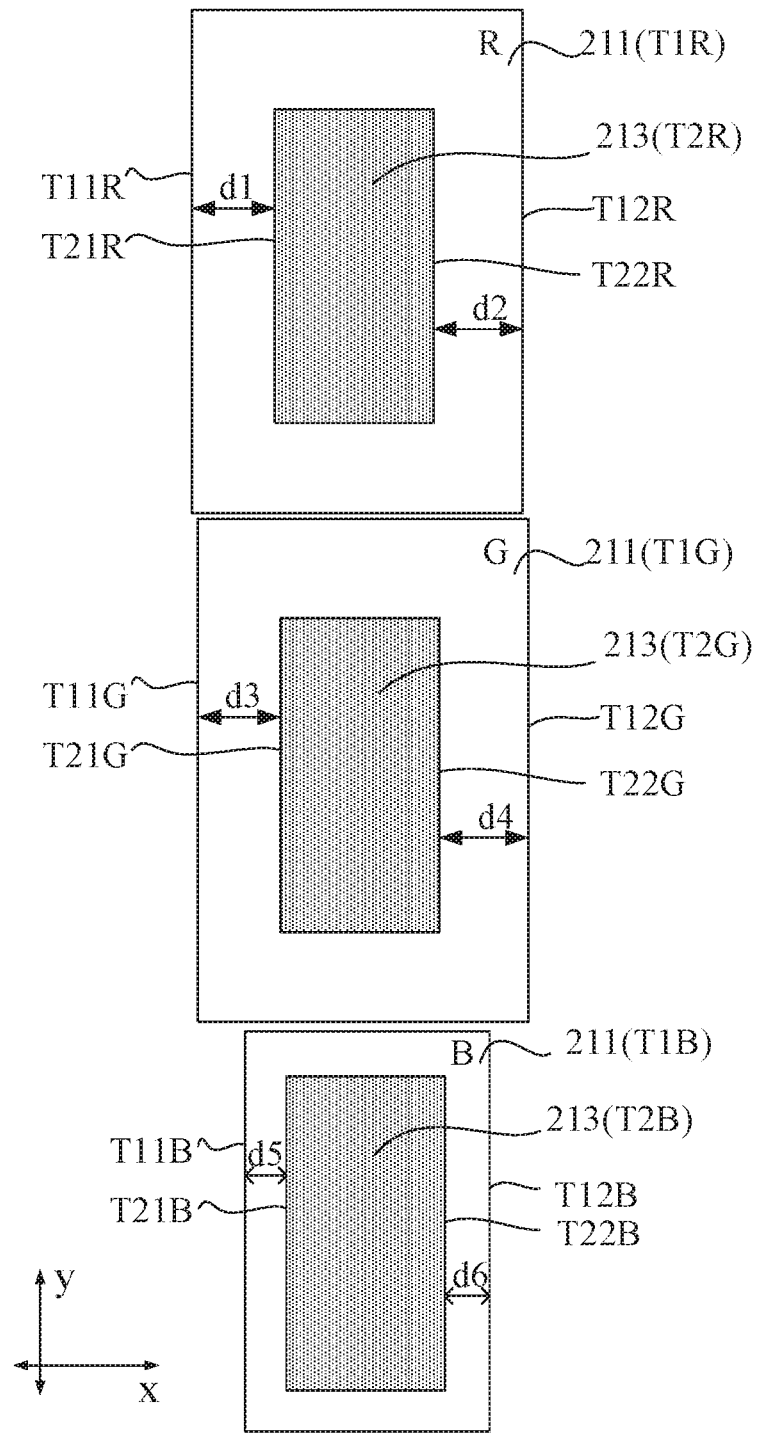
FIG. 5 is a schematic plan view of a red organic light-emitting device, a green organic light-emitting device, and a blue organic light-emitting device according to an embodiment of the present disclosure.

With further reference to FIG. 3, in this embodiment, the plurality of organic light-emitting devices 21 includes red organic light-emitting devices(s) R, green organic light-emitting devices G, and blue organic light-emitting devices B. In an example, as shown in FIG. 5, FIG. 5 is a schematic plan view of a red organic light-emitting device (R), a green organic light-emitting device (G), and a blue organic light-emitting device (B) according to an embodiment of the present disclosure. An orthographic projection of the first electrode 211 of each organic light-emitting device 21 on the plane of the display panel is a first orthographic projection T1, and an orthographic projection of the light-emitting layer 213 of each organic light-emitting device 21 on the plane of the display panel is a second orthographic projection T2. Here, the second orthographic projection T2 is located within the first orthographic projection T1.

As shown in FIG. 5, a distance between an edge of the first orthographic projection T1R of the red organic light-emitting device R and an edge of the second orthographic projection T2R of the red organic light-emitting device R is larger than a distance between an edge of the first orthographic projection T1B of the blue organic light-emitting device B and an edge of the second orthographic projection T2B of the blue organic light-emitting device B; and/or, a distance between an edge of the first orthographic projection T1G of the green organic light-emitting device G and an edge of the second orthographic projection T2G of the green organic light-emitting device G is larger than a distance between the edge of the first orthographic projection T1B of the blue organic light-emitting device B and the edge of the second orthographic projection T2B of the blue organic light-emitting device B.

It should be noted that in FIG. 5, shapes of the first electrode and the light-emitting layer of each organic light-emitting device are merely illustrative. In the actual production process, the first electrode and the light-emitting layer can be also formed into a rhombus shape, a square shape, etc., which will not be limited herein.

In the display panel, the first electrode and the storage capacitor are both made of a material having a low light transmittance, therefore, in the fingerprint recognition process, after the light emitted from the light source is reflected by the touching body, both the first electrode and the storage capacitor have a certain blocking effect on the reflected light. In the related art, the orthographic projection of the first electrode on the plane of the display panel does not overlap with the orthographic projection of the storage capacitor on the plane of the display panel, therefore, in the fingerprint recognition process, a part of the reflected light is blocked by the first electrode, and another part of the reflected light is blocked by the first electrode, thereby leading to a small amount of light getting into the fingerprint recognition unit and thus resulting in the low fingerprint identification accuracy. In this embodiment, the orthographic projection of at least one storage capacitor 220 located within the fingerprint recognition region 1 on the plane of the display panel is within the orthographic projection of the corresponding first electrode 211 on the plane of the display panel, that is, at least one first electrode 211 located within the fingerprint recognition region 1 covers the corresponding storage capacitor 220 in the normal direction of the display panel. In this way, in the fingerprint recognition process, after the light emitted from the light source is reflected by the touching body, only a part of the reflected light is blocked by the first electrode 211, and no additional part of the light is reflected by the storage capacitor 220, which is equivalent to reducing the blocking effect of the storage capacitor 220 on the reflected light. Therefore, with the display panel provided in this embodiment, compared with the related art, the amount of light that is blocked in the fingerprint recognition process and does not get into the fingerprint recognition unit can be decreased to some extent, and the fingerprint recognition accuracy can be improved.

Figure 6:
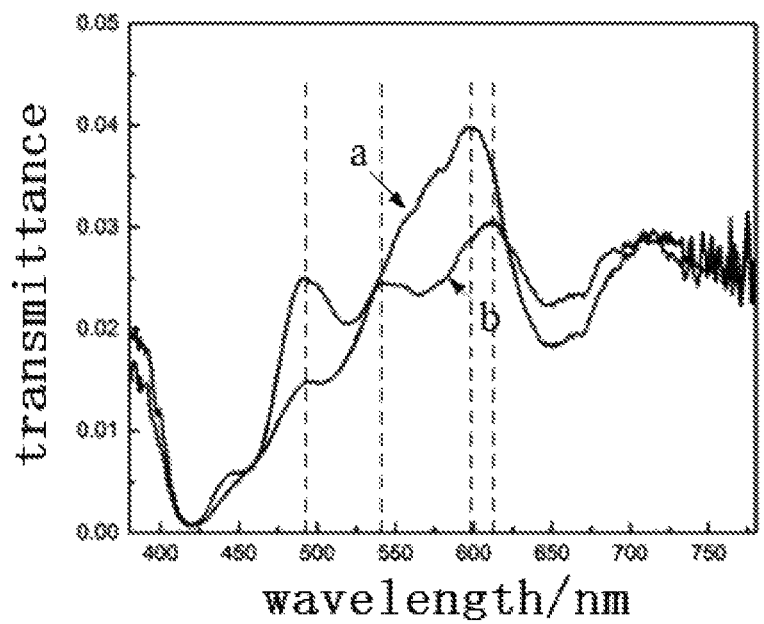
FIG. 6 is a schematic diagram showing light leakage of a display panel in the related art.

In addition, in the fingerprint recognition process, as shown in FIG. 1, the light source emits light, then the light is reflected by the fingerprint 2', and then the light gets into the fingerprint recognition unit 3' (such part of the light is effective light). However, if there is some light getting into the fingerprint recognition unit 3 without being reflected by the fingerprint 2 (e.g., the light propagating along the direction z in FIG. 1), i.e., light leakage occurs, the fingerprint detection will not be accurate. When the inventor of the present disclosure conducted a light leakage test on the display panel, it was found that light leakage of red light and green light was more serious than blue light. As shown in FIG. 6, FIG. 6 is a schematic diagram of light leakage of a display panel in the related art. Here in FIG. 6, a curve a represents a schematic diagram of light transmission when detecting from the back of the display panel, and a curve b represents a schematic diagram of light transmission when detecting from the front of the display panel. It can be seen from FIG. 6 that there are two peaks for the curve a nearby the wavelength of 480 nm and the wavelength of 600 nm, and there are two peaks for the curve b near the wavelength of 540 nm and the wavelength of 620 nm. The wavelength of red light is within the range of 620 nm-760 nm, the wavelength of green light is within the range of 500 nm-578 nm, and the wavelength of blue light is within the range of 446 nm-464 nm. Therefore, compared with blue light, light leakage is more likely to occur for red light and green light. Based on this, compared with the distance between the edge of the first electrode 211 of the blue organic light-emitting device B and the edge of the light-emitting layer 213 of the blue organic light-emitting device B, in this embodiment, the distance between the edge of the first electrode 211 of the red organic light-emitting device R and/or the green organic light-emitting device G and the light-emitting layer 213 of the red organic light-emitting device R and/or the green organic light-emitting device G is set to be larger, that is, the edge of the first electrode 211 of the red organic light-emitting device R and/or the green organic light-emitting device G is further away from the edge of the corresponding light-emitting layer 213, so that there is more light, which is emitted from the light-emitting layer 213 of the red organic light-emitting device R and/or the green organic light-emitting device G, reflected by the fingerprint and then gets into the fingerprint recognition unit, i.e., the amount of light getting into the fingerprint recognition unit without being reflected by the fingerprint can be decreased, thereby reducing the light leakage and thus improving the fingerprint recognition accuracy.

In an embodiment, along any direction in the plane of the display panel, for each organic light-emitting device, the first edge of the first orthographic projection, the first edge of the second orthographic projection, the second edge of the second orthographic projection, and the second edge of the first orthographic projection are sequentially arranged. Taking a first direction x as an example, as shown in FIG. 5, for the red organic light-emitting device R, the first edge T11R of the first orthographic projection T1R, the first edge T21R of the second orthographic projection T2R, the second edge T22R of the second orthographic projection T2R, and the second edge T12R of the first orthographic projection T1R are sequentially arranged. For the green organic light-emitting device G, the first edge TUG of the first orthographic projection T1G, the first edge T21G of the second orthographic projection T2G, the second edge T22G of the second orthographic projection T2G, and the second edge T12G of the first orthographic projection T1G are sequentially arranged. For the blue organic light-emitting device B, the first edge T11B of the first orthographic projection T1B, the first edge T21B of the second orthographic projection T2B, the second edge T22B of the second orthographic projection T2B, and the second edge T12B of the first orthographic projection T1B are sequentially arranged.

In this embodiment, the distance between the first edge T11R of the first orthographic projection T1R of the red organic light-emitting device R and the first edge T21R of the second orthographic projection T2R of the red organic light-emitting device R is a first distanced $d1$. The distance between the second edge T22R of the second orthographic projection T2R of the red organic light-emitting device R and the second edge T12R of the first orthographic projection T1R of the red organic light-emitting device R is a second distance $d2$. The distance between the first edge TUG of the first orthographic projection T1G of the green organic light-emitting device G and the first edge T21G of the second orthographic projection T2G of the green organic light-emitting device G is a third distance $d3$. The distance between the second edge T22G of the second orthographic projection T2G of the green organic light-emitting device G and the second edge T12G of the first orthographic projection T1G of the green organic light-emitting device G is a fourth distance $d4$. The distance between the first edge T11B of the first orthographic projection T1B of the blue organic light-emitting device B and the first edge T21B of the second orthographic projection T2B of the blue organic light-emitting device B is a fifth distance cis. The distance between the second edge T229 of the second orthographic projection T2B of the blue organic light-emitting device B and the second edge TIM of the first orthographic projection T1B of the blue organic light-emitting device B is a sixth distance $d6$.

The first distance $d1$ and the second distance $d2$ are both larger than the fifth distance $d5$, and the first distance $d1$ and the second distance $d2$ are both larger than the sixth distance $d6$; and/or, the third distance $d3$ and the fourth distance $d4$ are both larger than the fifth distance (15, and the third distance $d3$ and the fourth distance $d4$ are both larger than the sixth distance $d6$.

That is, the second orthographic projection of the fight-emitting layer 213 of each organic light-emitting device 21 is located within the vicinity of the center of the corresponding first orthographic projection. This can avoid a certain edge of the first orthographic projection overlapping with a certain edge of the second orthographic projection, so that the occurrence of light leakage can be further avoided for each organic light-emitting device 21.

In an example, the first distance $d1$ satisfies: $d1>4$ μm; the second distance $d2$ satisfies: $d2=4$ μm; the third distance $d3$ satisfies: $d3>4$ μm; the fourth distance $d4$ satisfies: $d4>4$ μm; the fifth distance $d5$ satisfies: $3.5$ μm$<d5<4$ μm; and the sixth distance $d6$ satisfies: $3.5$ μm$<d6<4$ μm.

Figure 7:
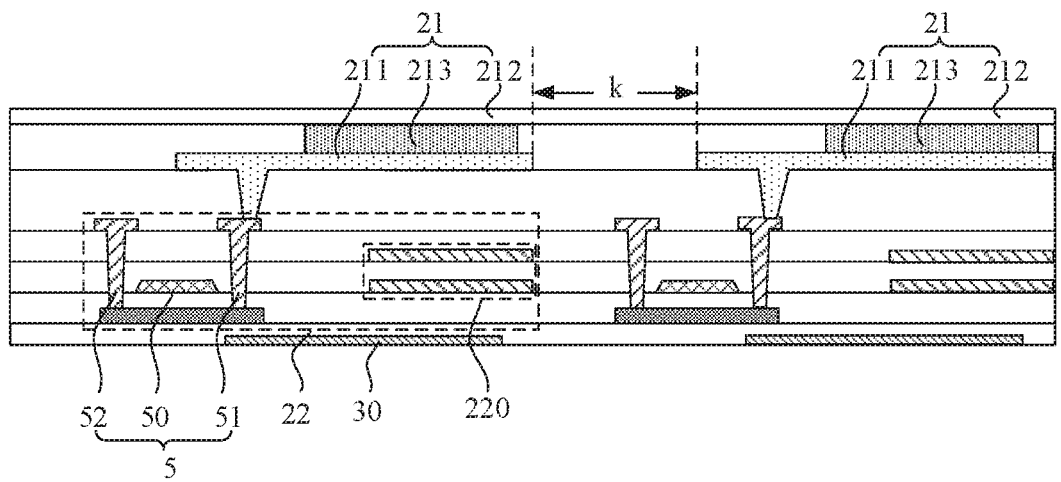
FIG. 7 is another schematic cross-section view of a fingerprint recognition region of a display panel according to an embodiment of the present disclosure.

In an example, as shown in FIG. 7, FIG. 7 is another schematic cross-section view of a fingerprint recognition region of a display panel according to an embodiment of the present disclosure. Based on reduction of light leakage, in this embodiment, a plurality of organic light-emitting devices 21 is arranged in a same layer, and a distance k between the first electrodes 211 of any two adjacent organic light-emitting devices satisfies: $k \geq 3$ μm, so as to avoid mutual influence of the displaying of two adjacent organic light-emitting devices.

In addition, it should be noted that each driving unit 22 further includes a plurality of thin film transistors. The thin film transistor has a smaller orthographic projection area on the plane of the display panel relative to the storage capacitor 220, and thus, the amount of reflected light blocked by the thin film transistor is smaller than the amount of reflected light blocked by of the storage capacitor 220. Therefore, the thin film transistor is not shown in FIG. 3 for the sake of simplicity. In FIG. 4, only one thin film transistor 5 directly connected to the organic light-emitting device 21 is illustrated as an example. As shown in FIG. 4, the thin film transistor 5 includes a gate electrode 50, a first electrode 51, and a second electrode 52. The first electrode 211 of the organic light-emitting device 21 is electrically connected to the first electrode 51.

In an embodiment, as shown in FIG. 3, the plurality of driving units 22 are arranged in an array, and the display panel further includes scan lines 31 and data lines 41. Each scan line 31 extends in the first direction x. Each scan line 31 is electrically connected to a respective one row of driving units 22, and the plurality of scan lines 31 is arranged along the second direction y. Each data line 41 extends in the second direction y. Each data line 41 is electrically connected to a respective one column of driving units 22, and the plurality of data lines 41 is arranged along the first direction x. The first direction x is different from the second direction y. In this embodiment, with the abovementioned arrangement of the driving units 22, driving units 22 in each row are electrically connected to a same scan line 31, such that each scan line 31 can drive driving units 22 in a same row. The driving units 22 in a row are electrically connected to a same data line 41, such that each data line 41 can drive driving units 22 in a same column. In this way, the plurality of driving units 22 can be neatly arranged on the display panel, simplifying the wiring number and facilitating the compact circuit layout design, thereby making it easy to achieve high resolution display.

With further reference to FIG. 3, the orthographic projection of the storage capacitor 220G corresponding to each green organic light-emitting device G on the plane of the display panel is located within the orthographic projection of the corresponding first electrode 211 on the plane of the display panel.

It should be noted that in the fingerprint recognition process, an external light source may be disposed on the display panel as a light source for the fingerprint recognition unit, or each organic light-emitting device used for normal display in the display panel may be used as a light source for the fingerprint recognition unit. For the red organic light-emitting device, the green organic light-emitting device, and the blue organic light-emitting device, green light emitted from the green organic light-emitting device has a high brightness and the light-emitting layer of the green organic light-emitting device has a long the lifetime. Therefore, when using an organic light-emitting device in the display panel as a light source for the fingerprint recognition unit, the light-emitting layer of the green organic light-emitting device is usually selected as a main light source for the fingerprint recognition unit. Based on this, in this embodiment, the orthographic projection of the storage capacitor 220G corresponding to each green organic light-emitting device G on the plane of the display panel is within the orthographic projection of the corresponding first electrode 211 on the plane of the display panel. That is, along the normal direction of the display panel, the first electrode 211 corresponding to the green organic light-emitting device G in the fingerprint recognition region covers the corresponding storage capacitor 220G. Thus, in the fingerprint recognition process, after the green light emitted from the light-emitting layer 213 of the green organic light-emitting device G is reflected by the fingerprint, only a part of the reflected light is blocked by the first electrode 211, thereby reducing the blocking effect of the storage capacitor 220 on the reflected light and thus improving the fingerprint recognition accuracy.

In an example, as shown in FIG. 3, the red organic light-emitting device R, the green organic light-emitting device G, and the blue organic light-emitting device B have a shape of rhombus or approximate rhombus.

It should be noted that considering that in the actual process production, the shapes of the respective organic light-emitting devices may not be geometrically absolute rhombus shapes, and the shape of approximate rhombus can be contained within the protection scope of the present disclosure when it does not affect the display and is within the allowable error range of the process. The following description and illustration with respect to the shapes are subject to the same explanation herein and will not be repeated.

With further reference to FIG. 3, as shown in FIG. 3, for any three adjacent rows of organic light-emitting devices 21, in the first row of organic light-emitting devices 21, the red organic light-emitting device R and the blue organic light-emitting device B are alternatively arranged; in the second row of organic light-emitting devices 21, green organic light-emitting devices G is sequentially arranged; and in the third row of organic light-emitting devices 21, the blue organic light-emitting device B and the red organic light-emitting device R are alternatively arranged. Any two adjacent rows of organic light-emitting devices are misaligned in the second direction y. As shown in FIG. 3, the second row of organic light-emitting device 21 is misaligned by a distance d in the first direction x with respect to the first row of organic light-emitting devices 21, and there is a distance c between two adjacent organic light-emitting devices in a same row, where d<c.

The abovementioned arrangement of the organic light-emitting devices may be referred to as a diamond arrangement. With this arrangement for the display panel, as shown in FIG. 3, each green organic light-emitting device G is associated with its closest red organic light-emitting device R and its closest blue organic light-emitting device B located on the upper row thereof, and associated with its closest red organic light-emitting device R and its closest blue organic light-emitting device B located on the lower row thereof, so as to form two pixel units (e.g., a pixel unit 61 and a pixel unit 62 shown in FIG. 3) to achieve color display. Therefore, with this pixel arrangement, and in combination with a corresponding pixel rendering method, the number of pixels per inch (Pixels Per inch, PPI) in the display panel can be increased with a limited number of pixels, so as to realize a high PPI display.

Figure 8:
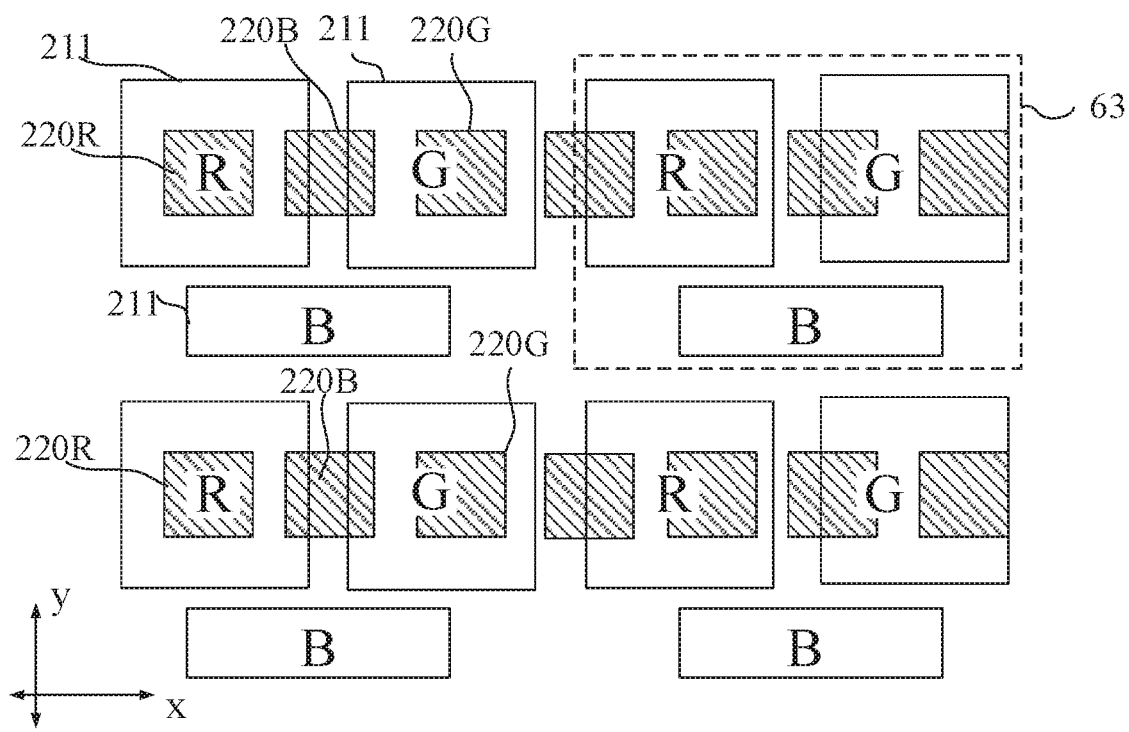
FIG. 8 is another schematic top view of a portion of a fingerprint identification region in FIG. 2.

For further improving the fingerprint recognition accuracy, an embodiment of the present disclosure further provides a display panel. As shown in FIG. 8, FIG. 8 is another schematic top view of a portion of a fingerprint identification region in FIG. 2. The red organic light-emitting device R and the green organic light-emitting device G both have a shape of square or approximate square and have a same area. The blue organic light-emitting device B has a shape of rectangle or approximately rectangle. For any two adjacent rows of organic light-emitting devices, in the first row of organic light-emitting devices, the red organic light-emitting device R and the green organic light-emitting device G are alternately arranged; and in the second row of organic light-emitting devices, blue organic light-emitting devices B is sequentially arranged. Here, along the first direction x, the blue organic light-emitting device B has a larger length than the red organic light-emitting device R. The orthographic projection of the blue organic light-emitting device B in the first direction x overlaps the orthographic projection of the red organic light-emitting device R in the first direction x, and the orthographic projection of the blue organic light-emitting device B in the first direction x also overlaps the orthographic projection of the green organic light-emitting device G in the first direction x.

The arrangement of the abovementioned organic light-emitting devices may be referred to as π-type pixel arrangement. With this π-type pixel arrangement, three organic light-emitting devices with different colors that are closest to each other constitute one pixel unit (e.g., a pixel unit 60 shown in FIG. 8). In this embodiment, in addition to making the orthographic projection of the storage capacitor 220G corresponding to the green organic light-emitting device G on the plane of the display panel be located within the orthographic projection of the corresponding first electrode 211 on the plane of the display panel, the orthographic projection of the storage capacitor 220R corresponding to the red organic light-emitting device R on the plane of the display panel can be located within the orthographic projection of the corresponding first electrode 211 on the plane of the display panel, that is, in the normal direction of the display panel, the first electrode 211 of the green organic light-emitting device G in the fingerprint recognition region covers the corresponding storage capacitor 220G, and the first electrode 211 of the red organic light-emitting device R covers the corresponding storage capacitor 220R. With this arrangement, the light transmission area and transmission amount of the reflected light in the display panel can be further increased, such that the fingerprint recognition accuracy can be improved.

Figure 9:
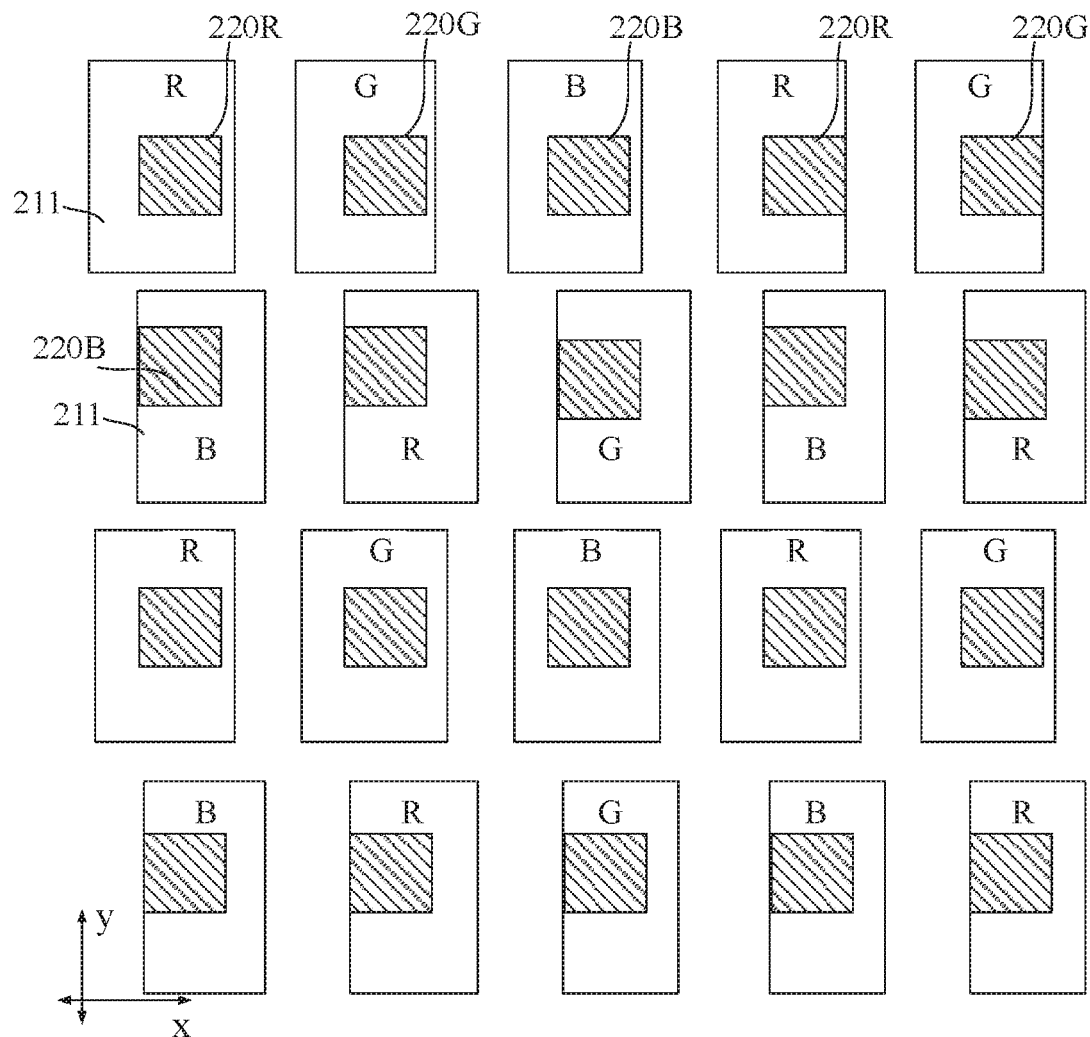
FIG. 9 is still another schematic top view of a portion of a fingerprint identification region in FIG. 2.

In one embodiment, along the normal direction of the display panel, in addition to the above solution in which the first electrode 211 of the green organic light-emitting device G covers the corresponding storage capacitor 220G and to the above solution in which the first electrode 211 of the green organic light-emitting device G in the fingerprint recognition region covers the corresponding storage capacitor 220G and the first electrode 211 of the red organic light-emitting device R covers the corresponding storage capacitor 220R, an embodiment of the present disclosure further provides a solution for further increasing the transmission amount of the reflected light. As shown in FIG. 9, FIG. 9 is still another schematic top view of a portion of a fingerprint identification region in FIG. 2. Here, the organic light-emitting devices 21 include red organic light-emitting devices R, green organic light-emitting devices G, and blue organic light-emitting devices B. In this embodiment, the red organic light-emitting device R, the green organic light-emitting device G, and the blue organic light-emitting device B cover the corresponding storage capacitors 220 along the normal direction of the display panel, respectively. As shown in FIG. 9, the orthographic projection of the storage capacitor 220R corresponding to each red organic light-emitting device R on the plane of the display panel is located within the orthographic projection of the corresponding first electrode 211 on the plane of the display panel; the orthographic projection of the storage capacitor 220G corresponding to each green organic light-emitting device G on the plane of the display panel is located within the orthographic projection of the corresponding first electrode 211 on the plane of the display panel; and the storage capacitor 220B corresponding to each blue organic light-emitting device B is located within the orthographic projection of the corresponding first electrode 211 on the plane of the display panel. With this arrangement, the light transmission area and transmission amount of the reflected light in the display panel can be further increased, such that the fingerprint recognition accuracy can be improved.

Based on this, the present disclosure provides the following two implementations to achieve that the first electrodes 211 of the red organic light-emitting device R, the green organic light-emitting device G and the blue organic light-emitting device B cover the corresponding storage capacitors 220, respectively.

First Implementation

Figure 10:
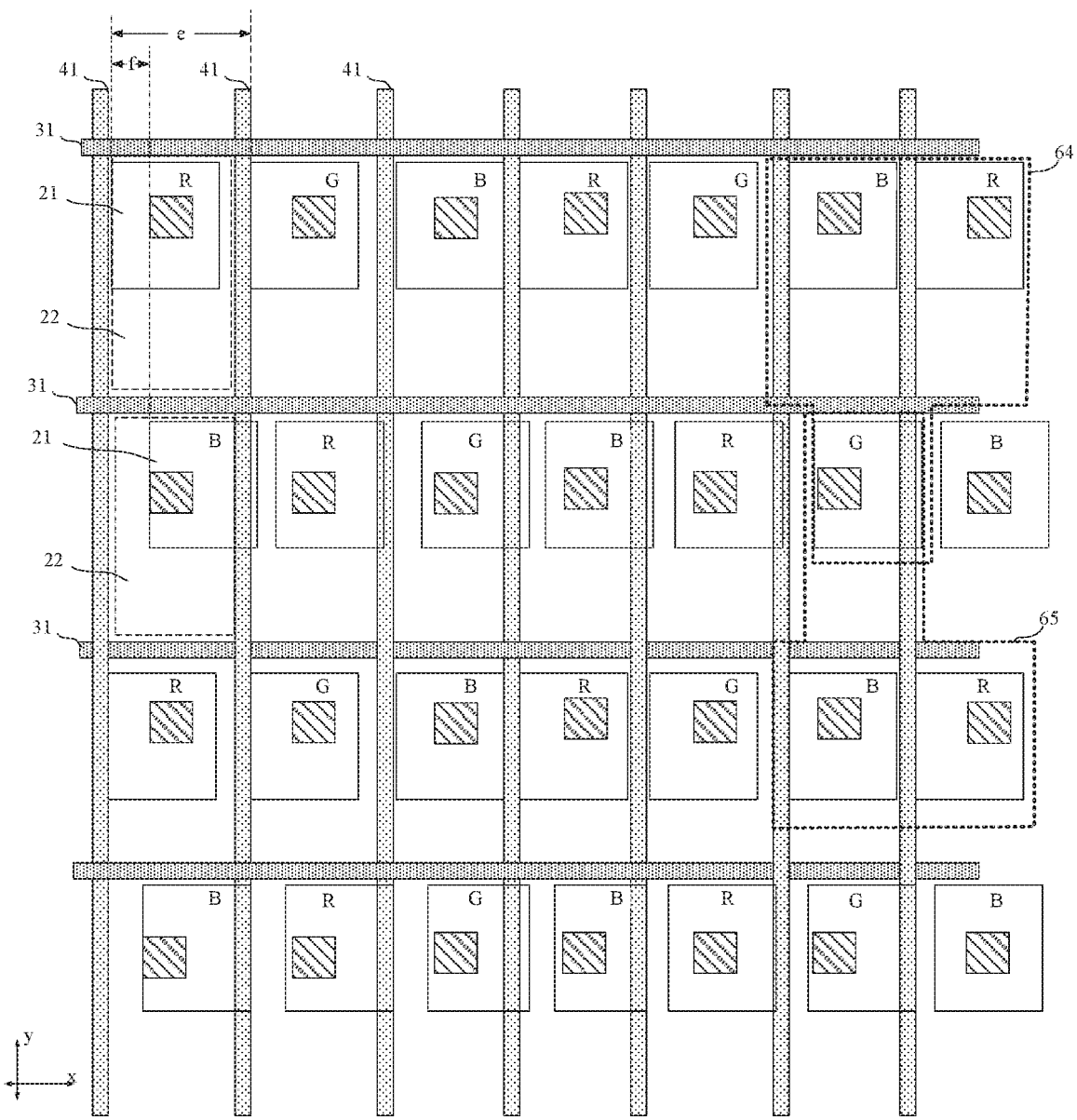
FIG. 10 is another schematic top view of a portion of a fingerprint identification region in FIG. 2.

As shown in FIG. 10, FIG. 10 is another schematic top view of a portion of a fingerprint identification region in FIG. 2. The display panel includes scan lines 31 and data lines 41, and the plurality of scan lines 31 intersects with the plurality of data lines 41 to define driving units 22 arranged in an array. Here, each scan line 31 extends in the first direction x, each scan line 31 is electrically connected to a corresponding row of driving units 22, and the plurality of scan lines 31 is arranged along the second direction y; each data line 41 extends along the second direction y, each data line 41 is electrically connected to a corresponding column of driving units 22, and the plurality of data lines 41 is arranged in the first direction x. The first direction x is different from the second direction y.

In combination with the arrangement of the driving units, as shown in FIG. 10, the organic light-emitting devices 21 located within the fingerprint recognition region 1 of the display panel are arranged in an array, and the organic light-emitting devices 21 include red organic light-emitting devices R, green organic light-emitting devices G and blue organic light-emitting devices B. Each organic light-emitting device 21 has a shape of rectangle or approximate rectangle. Any two adjacent rows of organic light-emitting devices 21 are misaligned in the second direction y. As shown in FIG. 10, for any one row of organic light-emitting devices 21, the red organic light-emitting device R, the green organic light-emitting device G, and the blue organic light-emitting device B are alternately arranged in this order. For any two adjacent rows of organic light-emitting devices 21, as shown in FIG. 10, the second row of organic light-emitting device 21 are misaligned by a distance f in the first direction x with respect to the first row of organic light-emitting devices 21, and the distance between two adjacent organic light-emitting devices in a same row is e, where f<e.

The abovementioned arrangement of the organic light-emitting devices may be referred to as a rendering arrangement. With the display panel with this arrangement, as shown in FIG. 10, each green organic light-emitting device G is respectively associated with its closest red organic light-emitting device R and its closest blue organic light-emitting device B located on the upper row thereof, and associated with its closest red organic light-emitting device R and its closest blue organic light-emitting device B located on the lower row thereof, so as to form two pixel units (e.g., a pixel unit 64 and a pixel unit 65 shown in FIG. 10). Similarly, each red organic light-emitting device R is respectively associated with its closest green organic light-emitting device G and its closest blue organic light-emitting device B located on the upper row thereof, and associated with its closest green organic light-emitting device G and its closest blue organic light-emitting device B located on the lower row thereof, so as to form two pixel units. Each blue organic light-emitting device B is respectively associated with its closest red organic light-emitting device R and its closest green organic light-emitting device G located on the upper row thereof, and associated with its closest red organic light-emitting device R and its closest green organic light-emitting device G located on the lower row thereof, so as to form two pixel units. Therefore, with this pixel arrangement, and in combination with a corresponding pixel rendering method, the high PPT display can be achieved with a limited number of pixels, which can improve the display effect.

Figure 11:
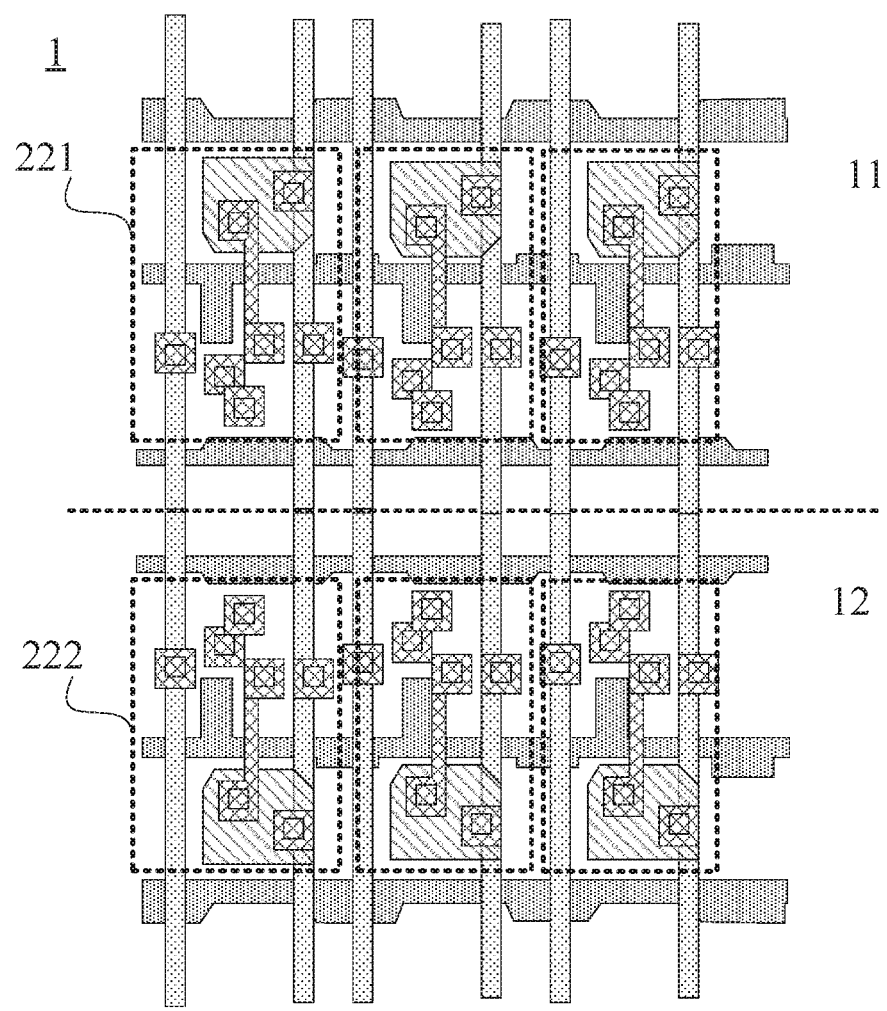
FIG. 11 is another schematic top view of a portion of a fingerprint identification region in FIG. 2.

In addition, based on the rendering arrangement of pixels, in an embodiment, the driving units 22 located within the fingerprint recognition region can be symmetrically arranged so as to free space located within the vicinity of the axis of symmetry in the fingerprint recognition region 1, thereby increasing the transmittance area of the reflected light. For example, as shown in FIG. 11, FIG. 11 is another schematic top view of a portion of a fingerprint identification region in FIG. 2. The fingerprint recognition region 1 has a symmetrical or approximately axis-symmetrical shape, and the fingerprint recognition region 1 includes an axis 10 of symmetry, a first fingerprint recognition region 11 and a second fingerprint recognition region 12 which are disposed on two sides of the axis 10 of symmetry, respectively.

The first fingerprint recognition region 11 includes first pixel units, and each first pixel unit includes a first driving unit 221. The second fingerprint recognition region 12 includes second pixel units, and each second pixel unit includes a second driving unit 222. The first driving unit 221 and the second driving unit 222 having the same distance from the axis 10 of symmetry are symmetric or approximately symmetrical with respect to the axis 10 of symmetry. With this arrangement in the embodiment, the space located within the vicinity of the symmetry axis 10 in the fingerprint recognition region 1 can be freed, which can further increase the light transmission area and transmission amount of the reflected light in the display panel and further improve the fingerprint recognition accuracy.

Second Implementation

Figure 12:
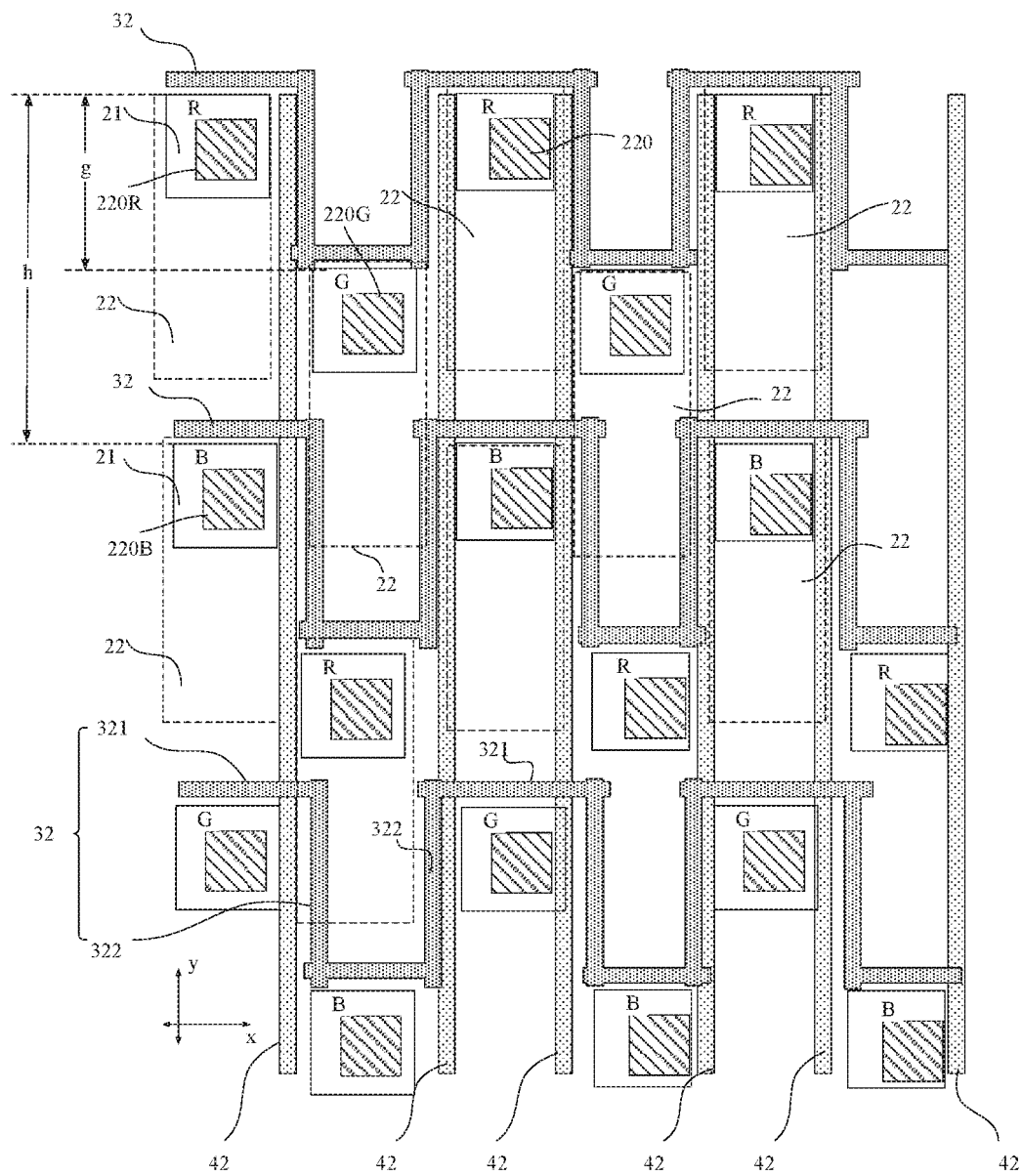
FIG. 12 is another schematic top view of a portion of a fingerprint identification region in FIG. 2.

As shown in FIG. 12, FIG. 12 is another schematic top view of a portion of a fingerprint identification region in FIG. 2. The display panel includes organic light-emitting devices 21, the odd-numbered columns of organic light-emitting devices 21 are aligned in the first direction x, the even-numbered column of organic light-emitting devices 21 are aligned in the first direction x, and any two adjacent columns of organic light-emitting devices 21 are misaligned in the first direction x. As shown in FIG. 12, the second column of organic light-emitting devices are misaligned by a distance g in the second direction y with respect to the first column of organic light-emitting devices and the distance between two adjacent organic light-emitting devices in a same column is h, where g<h.

The abovementioned arrangement of the organic light-emitting devices may be referred to as a square arrangement. With this square arrangement, correspondingly, for improving the fingerprint recognition accuracy, driving units 22 electrically connected to the organic light-emitting devices 21 in one-to-one correspondence is further provided in the fingerprint recognition region of the display panel. The driving units 22 are in one-to-one correspondence with the organic light-emitting devices 21.

As shown FIG. 12, the display panel further includes scan lines 32 and data lines 42. Each scan line 32 corresponds to two adjacent rows of driving units, and each scan line 32 includes scan signal transmission line sections 321 and scan signal connection line sections 322. Each scan signal transmission line section 321 extends in the first direction x, and each scan signal connection line section 322 extends in the second direction y. The plurality of scan signal transmission line sections 321 and the plurality of scan signal connection line sections 322 are arranged along the first direction x. Here, the first direction x is different from the second direction v.

For each scan line 32, two adjacent scan signal transmission line sections 321 are connected to each other through one scan signal connection line section 322, and two adjacent scan signal transmission line sections 321 are respectively electrically connected to the two adjacent rows of driving units. The odd-numbered scan signal transmission line section 321 is connected to one row of driving units, and the even-numbered scan signal transmission line section 321 is connected to the other row of driving units.

Each data line 42 extends in the second direction y, and each data line 4 is electrically connected to a corresponding column of driving units.

That is, this embodiment adjusts the arrangement of the driving units so as to match with the square arrangement of pixels, so that for the display panel with the square arrangement of pixels, the first electrodes 211 of the red organic light-emitting device R, the green organic light-emitting device G and the blue organic light-emitting device B cover the corresponding storage capacitors 220, so as to further increase the light transmission area and transmission amount of the reflected light in the fingerprint recognition region of the display panel, thereby improving the fingerprint recognition accuracy.

In an embodiment, as shown in FIG. 12, in this embodiment, the display panel further includes a light-sensing fingerprint recognition unit 30 corresponding to the fingerprint recognition region. The light-emitting layer 213 is reused as a light source of the light-sensing fingerprint recognition unit 30.

Figure 13:
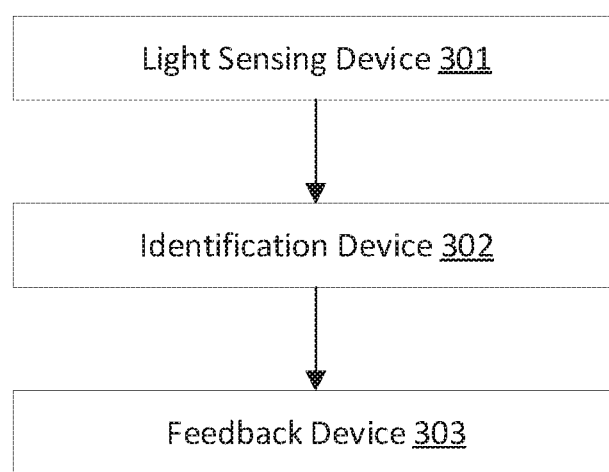
FIG. 13 is a schematic diagram of a light-sensing fingerprint recognition unit provided according to an embodiment of the present disclosure.

As shown in FIG. 13, FIG. 13 is a schematic diagram of a light-sensing fingerprint recognition unit provided according to an embodiment of the present disclosure. The light-sensing fingerprint recognition unit 30 includes a light-sensing device 301, an identification device 302, and a feedback device 303. In the fingerprint recognition process, the light emitted from the light source gets into the touching body, which reflects the light to form reflected light, and then the reflected light gets into the light-sensing device 301. The light-sensing device 301 is configured to sense the received light. The identification device 302 is electrically connected to the light-sensing device 301, and is configured to identify valleys and ridges of the fingerprint according to the light received by the light sensing device 301. The feedback device 303 is configured to feed back the fingerprint result recognized by the identification device 302 to a driving chip (not shown) for use in performing the corresponding operation.

Figure 14:
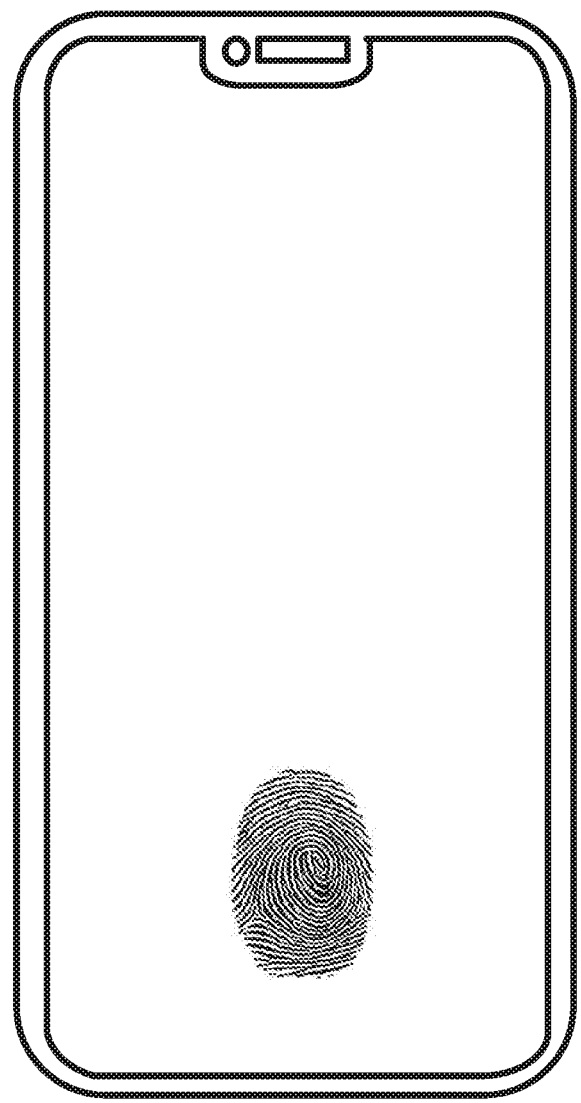
FIG. 14 is a schematic diagram of a display device according to an embodiment of the present disclosure.

As shown in FIG. 14, FIG. 14 is a schematic diagram of a display device according to an embodiment of the present disclosure. This embodiment provides a display device. The display device includes the abovementioned display panel. The specific structure of the display panel has been described in detail in the above embodiments, and will not be repeated herein. It should be noted that the display device shown in FIG. 14 is merely illustrative, and the display device can be any electronic device having a display function, such as a cellphone, a tablet computer, a notebook computer, an electronic paper book, a television, etc.

For the display device provided by the present disclosure, the orthographic projection of at least one storage capacitor located within the fingerprint recognition region on the plane of the display panel is located within the orthographic projection of the corresponding first electrode on the plane of the display panel, that is, along the normal direction of the display panel, at least one first electrode located within the fingerprint recognition region covers the corresponding storage capacitor. In this way, in the fingerprint recognition process, after the light emitted from the light source is reflected by the touching body, only a part of the reflected light is blocked by the first electrode, and no additional part of the light is blocked by the storage capacitor, which is equivalent to reducing the blocking effect of the storage capacitor on the reflected light. Therefore, with the display panel provided in this embodiment, compared with the related art, the amount of light that may not get into the fingerprint recognition unit due to being blocked in the fingerprint recognition process can be decreased to some extent, and the fingerprint recognition accuracy can be improved. In addition, compared with the distance between the edge of the first electrode of the blue organic light-emitting device and the edge of the light-emitting layer of the blue organic light-emitting device, in this embodiment, by setting the distance between the edge of the first electrode of the red organic light-emitting device and/or the green organic light-emitting device and the light-emitting layer of the red organic light-emitting device and/or the green organic light-emitting device to be larger, there can be more light that is emitted from the light-emitting layer of the red organic light-emitting device and/or the green organic light-emitting device, is reflected by the fingerprint and then gets into the fingerprint recognition unit, i.e., the amount of light getting into the fingerprint recognition unit without being reflected by the fingerprint can be decreased, such that the fingerprint recognition accuracy can be improved.

What is claimed is:

1. A display panel, comprising:
a plurality of pixel units arranged in a fingerprint recognition region, wherein each of the plurality of pixel units comprises a plurality of organic light-emitting devices and a plurality of driving units, the plurality of organic light-emitting devices is electrically connected to the plurality of driving units, each of the plurality of organic light-emitting devices comprises a first electrode, a light-emitting layer and a second electrode that are stacked, and the first electrode is electrically connected to a corresponding driving unit of the plurality of driving units,
wherein each driving unit of the plurality of driving units comprises a storage capacitor, and an orthographic projection of the storage capacitor on a plane of the display panel is located within an orthographic projection of a corresponding first electrode on the plane of the display panel,
wherein an orthographic projection of the first electrode of each organic light-emitting device of the plurality of organic light-emitting devices on the plane of the display panel is a first orthographic projection, and an orthographic projection of the light-emitting layer of each organic light-emitting device of the plurality of organic light-emitting devices on the plane of the display panel is a second orthographic projection, wherein the second orthographic projection is located within the first orthographic projection, and
wherein the plurality of organic light-emitting devices comprises a red organic light-emitting device, a green organic light-emitting device, and a blue organic light-emitting device; wherein at least one of the following conditions is satisfied:
a distance between an edge of the first orthographic projection of the red organic light-emitting device and an edge of the second orthographic projection of the red organic light-emitting device is larger than a distance between an edge of the first orthographic projection of the blue organic light-emitting device and an edge of the second orthographic projection of the blue organic light-emitting device; and
a distance between an edge of the first orthographic projection of the green organic light-emitting device and an edge of the second orthographic projection of the green organic light-emitting device is larger than a distance between the edge of the first orthographic projection of the blue organic light-emitting device and the edge of the second orthographic projection of the blue organic light-emitting device.

2. The display panel according to claim 1, wherein for each organic light-emitting device of the plurality of organic light-emitting devices, a first edge of the first orthographic projection, a first edge of the second orthographic projection, a second edge of the second orthographic projection, and a second edge of the first orthographic projection are sequentially arranged along any direction in the plane of the display panel,
wherein a distance between the first edge of the first orthographic projection of the red organic light-emitting device and the first edge of the second orthographic projection of the red organic light-emitting device is a first distance d1, and a distance between the second edge of the second orthographic projection of the red organic light-emitting device and the second edge of the first orthographic projection of the red organic light-emitting device is a second distance d2,
wherein a distance between the first edge of the first orthographic projection of the green organic light-emitting device and the first edge of the second orthographic projection of the green organic light-emitting device is a third distance d3, and a distance between the second edge of the second orthographic projection of the green organic light-emitting device and the second edge of the first orthographic projection of the green organic light-emitting device is a fourth distance d4,
wherein a distance between the first edge of the first orthographic projection of the blue organic light-emitting device and the first edge of the second orthographic projection of the blue organic light-emitting device is a fifth distance d5, and a distance between the second edge of the second orthographic projection of the blue organic light-emitting device and the second edge of the first orthographic projection of the blue organic light-emitting device is a sixth distance d6, and
wherein at least one of the following conditions is satisfied:
both the first distance d1 and the second distance d2 are larger than the fifth distance d5, and both the first distance d1 and the second distance d2 are larger than the sixth distance d6; and
both the third distance d3 and the fourth distance d4 are larger than the fifth distance d5, and both the third distance d3 and the fourth distance d4 are larger than the sixth distance d6.

3. The display panel according to claim 2, wherein the first distance d1 satisfies d1>4 µm, the second distance d2 satisfies d2>4 µm, the third distance d3 satisfies d3>4 µm, the fourth distance d4 satisfies d4>4 μm, the fifth distance d5 satisfies 3.5 μm<d5<4 μm, and the sixth distance d6 satisfies 3.5 μm<d6<4 μm.

4. The display panel according to claim 3, wherein the plurality of organic light-emitting devices is disposed in a same layer, and a distance k between the first electrodes of any two adjacent organic light-emitting devices of the plurality of organic light-emitting devices satisfies k≥3 μm.

5. The display panel according to claim 1, wherein the plurality of driving units are arranged in an array, and the display panel further comprises a plurality of scan lines and a plurality of data lines,
wherein each of the plurality of scan lines extends along a first direction and is electrically connected to a corresponding row of driving units of the plurality of driving units, and the plurality of scan lines is arranged along a second direction,
wherein each of the plurality of data lines extends along the second direction and is electrically connected to a corresponding column of driving units of the plurality of driving units, and the plurality of data lines is arranged along the first direction,
wherein the first direction is different from the second direction, and
wherein the orthographic projection of the storage capacitor corresponding to each green organic light-emitting device on the plane of the display panel is located within the orthographic projection of the corresponding first electrode on the plane of the display panel.

6. The display panel according to claim 5, wherein the red organic light-emitting device, the green organic light-emitting device, and the blue organic light-emitting device have a shape of rhombus or approximate rhombus,
wherein for any three adjacent rows of organic light-emitting devices of the plurality of organic light-emitting devices, in a first row of organic light-emitting devices, the red organic light-emitting device and the blue organic light-emitting device are alternately arranged; in a second row of organic light-emitting devices, the green organic light-emitting device is repeatedly arranged; in a third row of organic light-emitting devices, the blue organic light-emitting device and the red organic light-emitting device are alternately arranged, and any two adjacent rows of organic light-emitting devices of the plurality of organic light-emitting devices are misaligned in the second direction.

7. The display panel according to claim 5, wherein the red organic light-emitting device and the green organic light-emitting device have a shape of square or approximate square, the red organic light-emitting device and the green organic light-emitting device have a same area, the blue organic light-emitting device has a shape of rectangle or approximate rectangle,
wherein for any two adjacent rows of organic light-emitting devices, in a first row of organic light-emitting devices, the red organic light-emitting device and the green organic light-emitting device are alternately arranged; and in a second row of organic light-emitting devices, the blue organic light-emitting device is repeatedly arranged,
wherein a length of the blue organic light-emitting device in the first direction is larger than a length of the red organic light-emitting device in the first direction; an orthographic projection of the blue organic light-emitting device in the first direction overlaps with an orthographic projection of the red organic light-emitting device in the first direction; and an orthographic projection of the blue organic light-emitting device in the first direction overlaps with an orthographic projection of the green organic light-emitting device in the first direction, and
wherein the orthographic projection of the storage capacitor corresponding to the red organic light-emitting device on the plane of the display panel is located within the orthographic projection of the corresponding first electrode on the plane of the display panel.

8. The display panel according to claim 1,
wherein an orthographic projection of the storage capacitor corresponding to the red organic light-emitting device on the plane of the display panel is located within the orthographic projection of the corresponding first electrode on the plane of the display panel,
wherein an orthographic projection of the storage capacitor corresponding to the green organic light-emitting device on the plane of the display panel is located within the orthographic projection of the corresponding first electrode on the plane of the display panel, and
wherein an orthographic projection of the storage capacitor corresponding to the blue organic light-emitting device on the plane of the display panel is located within the orthographic projection of the corresponding first electrode on the plane of the display panel.

9. The display panel according to claim 8, wherein the display panel further comprises a plurality of scan lines and a plurality of data lines; and the plurality of scan lines intersects with the plurality of data lines to define the plurality of driving units arranged in an array,
wherein each of the plurality of scan lines extends along a first direction and is electrically connected to a corresponding row of driving units of the plurality of driving units; and the plurality of scan lines is arranged along a second direction,
wherein each of the plurality of data lines extends along the second direction and is electrically connected to a corresponding column of driving units of the plurality of driving units; and the plurality of data lines is arranged along the first direction, and
wherein the first direction is different from the second direction.

10. The display panel according to claim 9, wherein the plurality of organic light-emitting devices is arranged in an array; each of the plurality of organic light-emitting devices has a shape of rectangle or approximate rectangle, and any two adjacent rows of organic light-emitting devices of the plurality of organic light-emitting devices are misaligned in the second direction.

11. The display panel according to claim 10, wherein the fingerprint recognition region has an axis-symmetrical or approximately axis-symmetrical shape, and the fingerprint recognition region comprises an axis of symmetry, a first fingerprint recognition region and a second fingerprint recognition region respectively disposed on two sides of the axis of symmetry,
wherein a plurality of first pixel units is arranged in the first fingerprint recognition region, and each of the plurality first pixel units comprises a first driving unit; a plurality of second pixel units is arranged in the second fingerprint recognition region, and each of the plurality of second pixel units comprises a second driving unit, and
wherein the first driving unit and the second driving unit having a same distance from the axis of symmetry are symmetric or approximately symmetric with respect to the axis of symmetry.

12. The display panel according to claim 8, wherein odd-numbered columns of organic light-emitting devices of the plurality of organic light-emitting devices are aligned in a first direction; even-numbered columns of organic light-emitting devices of the plurality of organic light-emitting devices are aligned in the first direction; and two adjacent columns of organic light-emitting devices of the plurality of organic light-emitting devices are misaligned in the first direction, and wherein the plurality of driving units is in one-to-one correspondence with the plurality of organic light-emitting devices.

13. The display panel according to claim 12, wherein the display panel further comprises a plurality of scan lines and a plurality of data lines, wherein each of the plurality of scan lines corresponds to two adjacent rows of driving units of the plurality of driving units; each of the plurality of scan lines comprises a plurality of scan signal transmission line sections and a plurality of scan signal connection line sections; each of the plurality of scan signal transmission line sections extends along the first direction, each of the plurality of scan signal connection line sections extends along a second direction, the plurality of scan signal transmission line sections and the plurality of scan signal connection line sections are arranged along the first direction; and the first direction is different from the second direction, wherein for each of plurality of scanning lines, two adjacent scan signal transmission line sections of the plurality of scan signal transmission line sections are connected to each other through one scan signal connection line section of the plurality of scan signal connection line sections, and two adjacent scan signal transmission line sections are connected to two adjacent rows of driving units of the plurality of driving units, wherein an odd-numbered scan signal transmission line section of the plurality of scan signal transmission line sections is connected to one of the two adjacent rows of driving units of the plurality of driving units, and an even-numbered scan signal transmission line section is connected to the other one of the two adjacent rows of driving units of the plurality of driving units, and wherein each of the plurality of data lines extends along the second direction, and is electrically connected to a corresponding one column of driving units of the plurality of driving units.

14. The display panel according to claim 1, wherein the display panel further comprises a light-sensing fingerprint recognition unit corresponding to the fingerprint recognition region, and the light-emitting layer is reused as a light source of the light-sensing fingerprint recognition unit, wherein the light-sensing fingerprint identification unit comprises a light-sensing device, an identification device and a feedback device, and wherein the light-sensing device is configured to sense received light, the identification device is configured to identify a valley and a ridge of a fingerprint based on light received by the light-sensing device, and the feedback device is configured to feed back to a driving chip a fingerprint result recognized by the identification device.

15. A display device, comprising:

a display panel, wherein the display panel comprises a plurality of pixel units arranged in a fingerprint recognition region, wherein each of the plurality of pixel units comprises a plurality of organic light-emitting devices and a plurality of driving units, the plurality of organic light-emitting devices is electrically connected to the plurality of driving units, each of the plurality of organic light-emitting devices comprises a first electrode, a light-emitting layer and a second electrode that are stacked, and the first electrode is electrically connected to a corresponding driving unit of the plurality of driving units, wherein each driving unit of the plurality of driving units comprises a storage capacitor, and an orthographic projection of the storage capacitor on a plane of the display panel is located within an orthographic projection of a corresponding first electrode on the plane of the display panel, wherein an orthographic projection of the first electrode of each organic light-emitting device of the plurality of organic light-emitting devices on the plane of the display panel is a first orthographic projection, and an orthographic projection of the light-emitting layer of each organic light-emitting device of the plurality of organic light-emitting devices on the plane of the display panel is a second orthographic projection, wherein the second orthographic projection is located within the first orthographic projection, and wherein the plurality of organic light-emitting devices comprises a red organic light-emitting device, a green organic light-emitting device, and a blue organic light-emitting device; wherein at least one of the following conditions is satisfied:

a distance between an edge of the first orthographic projection of the red organic light-emitting device and an edge of the second orthographic projection of the red organic light-emitting device is larger than a distance between an edge of the first orthographic projection of the blue organic light-emitting device and an edge of the second orthographic projection of the blue organic light-emitting device; and a distance between an edge of the first orthographic projection of the green organic light-emitting device and an edge of the second orthographic projection of the green organic light-emitting device is larger than a distance between the edge of the first orthographic projection of the blue organic light-emitting device and the edge of the second orthographic projection of the blue organic light-emitting device.

\* \* \* \* \*